United States Patent
Ji et al.

(10) Patent No.: US 6,924,542 B2
(45) Date of Patent: Aug. 2, 2005

(54) TRENCH ISOLATION WITHOUT GROOVING

(75) Inventors: Hua Ji, San Jose, CA (US); Dong Jun Kim, San Jose, CA (US); Jin-Ho Kim, San Jose, CA (US); Chuck Jang, Fremont, CA (US)

(73) Assignee: ProMos Technologies, Inc., Hsin Chu (TW)

( * ) Notice: Subject to any disclaimer, the term of this patent is extended or adjusted under 35 U.S.C. 154(b) by 0 days.

(21) Appl. No.: 10/901,948

(22) Filed: Jul. 29, 2004

(65) Prior Publication Data

US 2005/0003630 A1 Jan. 6, 2005

Related U.S. Application Data

(62) Division of application No. 10/305,464, filed on Nov. 26, 2002, now Pat. No. 6,787,409.

(51) Int. Cl.[7] .................... H01L 29/00; H01L 21/8238
(52) U.S. Cl. .................. 257/501; 257/506; 257/510; 257/513; 438/221; 438/296; 438/426; 438/435
(58) Field of Search .......................... 438/221, 296, 438/426, 431, 424, 435; 257/506, 510, 501, 513

(56) References Cited

U.S. PATENT DOCUMENTS

| | | | |
|---|---|---|---|
| 6,100,160 A | * | 8/2000 | Hames .................. 438/424 |
| 6,140,208 A | | 10/2000 | Agahi et al. |
| 6,146,974 A | | 11/2000 | Liu et al. |
| 6,165,854 A | | 12/2000 | Wu |
| 6,171,909 B1 | | 1/2001 | Ding et al. |
| 6,235,606 B1 | * | 5/2001 | Huang et al. .......... 438/400 |
| 6,306,725 B1 | | 10/2001 | Nag et al. |
| 6,358,796 B1 | | 3/2002 | Lin et al. |
| 6,426,272 B1 | | 7/2002 | Fu et al. |
| 6,534,378 B1 | | 3/2003 | Ramkumar et al. |
| 6,653,203 B1 | | 11/2003 | Huang et al. |
| 6,784,077 B1 | * | 8/2004 | Lin et al. ............... 438/426 |
| 2002/0135025 A1 | | 9/2002 | Park |

* cited by examiner

Primary Examiner—Hsien-Ming Lee
(74) Attorney, Agent, or Firm—MacPherson Kwok Chen & Heid LLP; David S. Park

(57) ABSTRACT

A method and structure to form shallow trench isolation regions without trench oxide grooving is provided. In particular, a method includes a two-step oxide process in which an oxide liner lines the inside surface of a trench and the trench is filled with a bulk oxide layer, preferably using a high density plasma chemical vapor deposition (HDP-CVD) process. The oxide liner and the bulk oxide layer are formed to have similar etch rates. Thus, when etching the oxide liner and the bulk oxide layer between stack structures, a common dielectric top surface is formed that is substantially planar and without grooves.

19 Claims, 4 Drawing Sheets

TRENCH ISOLATION WITHOUT GROOVING

CROSS-REFERENCE TO RELATED APPLICATIONS

This is a divisional application of U.S. patent application Ser. No. 10/305,464, filed Nov. 26, 2002, now U.S. Pat. 6,787,409 which is herein incorporated by reference for all purposes.

BACKGROUND OF THE INVENTION

1. Field of Invention

The present invention generally relates to semiconductor processing. More particularly, the present invention relates to forming trench isolation structures during semiconductor device fabrication.

2. Discussion of the Related Art

With the ever-increasing number of semiconductor devices being built on a single chip, the art of isolating semiconductor devices has become an important aspect of modern semiconductor and integrated circuit technology. Improper isolation among devices will cause current leakage, which can consume a significant amount of power. Improper isolation can also result in defects such as noise margin degradation, voltage shift, and crosstalk.

Trench isolation is an isolation technique developed especially for a semiconductor chip with high integration. Shallow trench isolation (STI), in particular, is often used in the fabrication of integrated circuit devices to isolate active areas from one another. The trench regions are formed in the semiconductor substrate by recessing the substrate deep enough for isolation and filling with insulating material to provide the isolation among active devices or different well regions.

High density plasma chemical vapor deposition (HDP-CVD) of dielectric material has been previously used for STI gapfill. The HDP-CVD process includes a deposition component and a sputtering component to simultaneously deposit and etch the dielectric material in the same reaction, thereby allowing material to be deposited very densely and without voids.

Liner oxide layers have been used to prevent plasma damage to an underlying substrate from the HDP-CVD gapfill process. Such a method requires that the liner oxide layer be of sufficient thickness to prevent damage to underlying layers from the sputtering component of the HDP-CVD process. For example, the use of one layer of thick thermal oxide is known, but such a technique has caused corner effects such as gate wrap around and parasitic leakage. Furthermore, in the fabrication of flash memory devices, the use of only a single layer of thick thermal oxide will cause the tunnel oxide to be thicker at the edges of the active area.

The use of a thermal oxide layer in conjunction with a high temperature CVD oxide (HTO) is known to advantageously solve the aforementioned problems. However, this technique may cause grooving of the oxide in a subsequent etch step, as shown in FIG. 1. Oxide layers 2 and 4 form grooves 8 while bulk oxide layer 6 is substantially level along a top surface of the dielectric layers. Furthermore, such a technique requires three steps of oxide deposition: one thermal oxide layer formation; one HTO layer formation; and one gapfill oxide layer formation. Thus, such a process involves a relatively high thermal budget and long process time.

Therefore, what is needed is a trench isolation technique that protects the underlying layers and/or the substrate from plasma damage and also provides a flat and uniform surface level of the dielectric in the trench after an etch. Furthermore, a highly efficient trench isolation process in terms of process cycle time and thermal budget is desirable.

SUMMARY

The present invention provides a method of forming trench isolation structures without dielectric grooving. A method of forming trench isolation structures with improved thermal budget and process cycle time is also provided.

According to one embodiment of the present invention, a method of forming an isolation trench is provided, comprising forming a plurality of stack structures over a substrate, etching a trench in the substrate between two of the stack structures, forming an oxide liner over the trench, and depositing a bulk oxide layer over the oxide liner to fill the trench. The oxide liner has a similar etch rate as the bulk oxide layer and in one example, the etch rate of the oxide liner is within about 10% of the etch rate of the bulk oxide layer. Furthermore, the method includes etching the oxide liner and the bulk oxide layer to form a dielectric top surface between the two stack structures, wherein the dielectric top surface is substantially planar and below a top surface of the two stack structures.

According to another embodiment of the present invention, a method of forming an isolation trench is provided, comprising forming a plurality of stack structures over a substrate, etching a trench in the substrate between two of the stack structures, growing a thermal oxide layer over the trench, and filling the trench using a high density plasma chemical vapor deposition (HDP-CVD) process. The HDP-CVD process includes depositing an in-situ oxide layer over the thermal oxide layer, and depositing a bulk oxide layer over the in-situ oxide layer, wherein the in-situ oxide layer has a similar etch rate as the bulk oxide layer. In one example, the etch rate of the in-situ oxide layer is within about 10% of the etch rate of the bulk oxide layer. The method further includes etching the thermal oxide layer, the in-situ oxide layer, and the bulk oxide layer to form a dielectric top surface between the two stack structures, wherein the dielectric top surface is substantially planar and below a top surface of the two stack structures.

According to another embodiment of the present invention, a trench isolation structure is provided, comprising two stack structures over a substrate, a trench in the substrate between the two stack structures, an oxide liner over the trench, and a bulk oxide layer over the oxide liner, wherein the etch rate of the oxide liner is within about 10% of the etch rate of the bulk oxide layer.

Advantageously, the present invention allows for a highly efficient trench isolation process in which a uniform trench dielectric is formed substantially level at a top surface without grooving after an etch step. Furthermore, the present invention allows for improved efficiency by providing for a lower thermal budget and a shorter process time.

These and other features and advantages of the present invention will be more readily apparent from the detailed description of the embodiments set forth below taken in conjunction with the accompanying drawings.

BRIEF DESCRIPTION OF DRAWINGS

Use of the same reference symbols in different figures indicates similar or identical items. It is further noted that the drawings may not be drawn to scale.

DETAILED DESCRIPTION

FIGS. 2–8 illustrate a process sequence utilizing a method to form trench isolation structures in accordance with one embodiment of the present invention. Advantageously, the present invention allows for trench isolation structures to be formed with substantially level gapfill oxide layers without grooving and with improved thermal budget and process cycle time.

Figure 2:
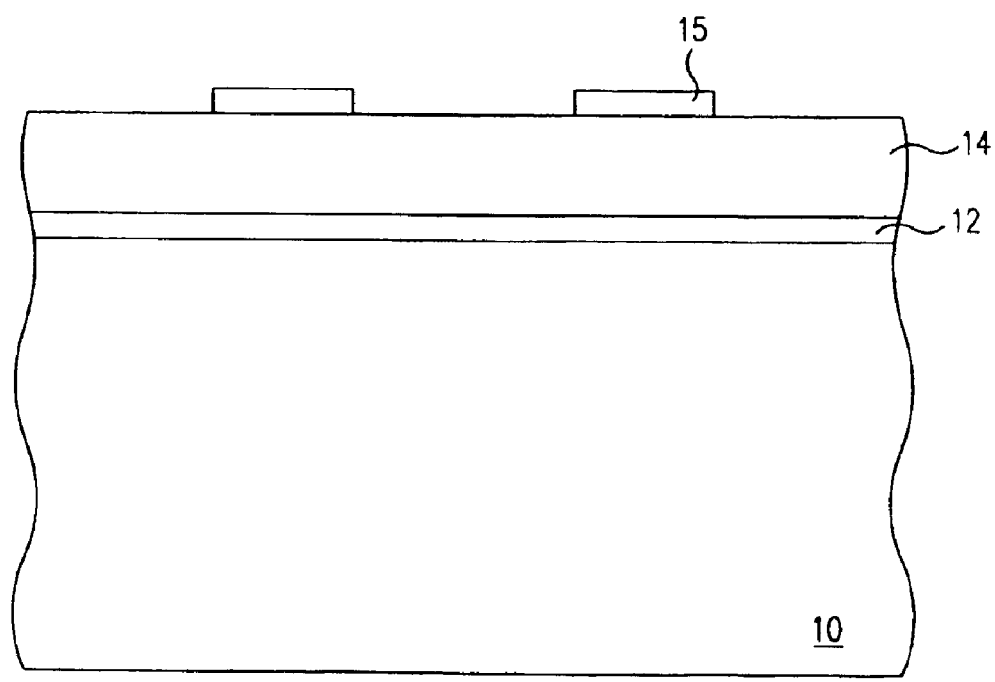
FIG. 2 shows a cross-section view of layers of material formed above a semiconductor substrate.
Figure 3:
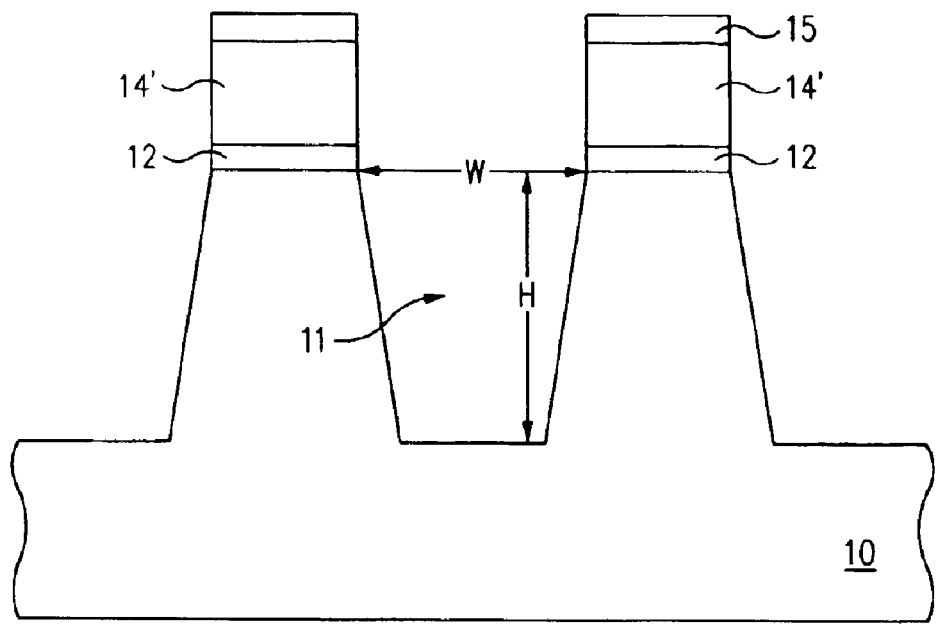
FIG. 3 shows a cross-section view of a semiconductor substrate with trenches, in accordance with an embodiment of the present invention.

FIG. 2 illustrates a cross-section view of one example of a semiconductor device structure or portion of a semiconductor device structure in which the present invention may be used. As shown in FIG. 2, layers of material are formed over a semiconductor substrate 10 and trenches are subsequently formed therein (FIG. 3). Substrate 10 may be doped by conventional means with dopants at different dosage and energy levels to form wells. Substrate 10 may be a wafer formed from a single crystalline silicon material. Substrate 10 may also comprise other materials, for example, an epitaxial material, a polycrystalline semiconductor material, or other suitable material. It is noted that substrate 10 can further include additional layers, structures, and/or devices.

Figure 8:
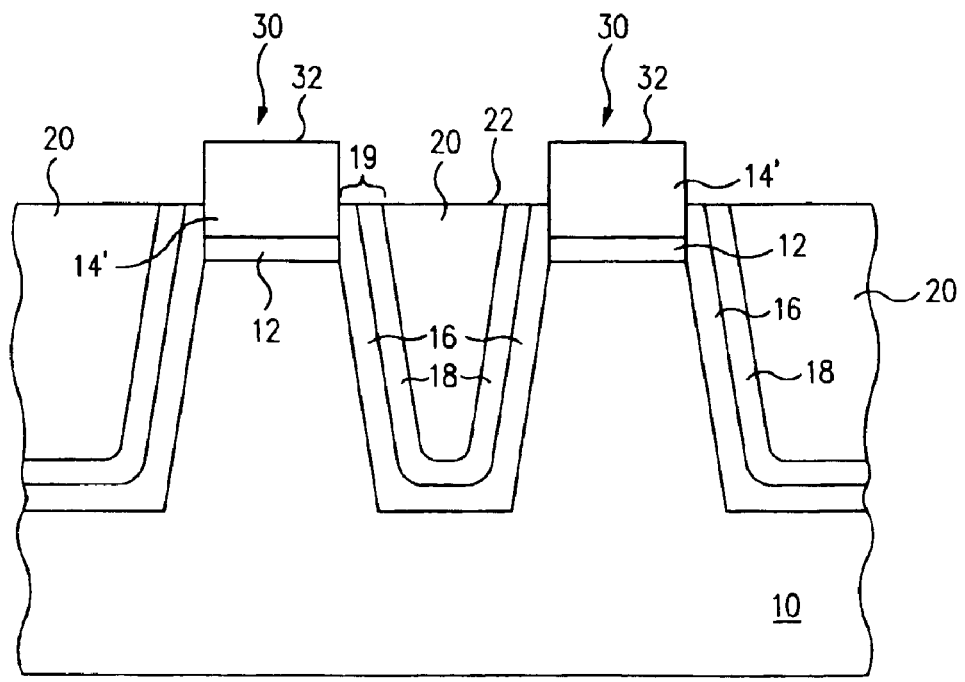
FIG. 8 shows a cross-section view of the structure illustrated in FIG. 7 after an etch step, in accordance with an embodiment of the present invention.

As further shown in FIG. 2, a thin insulator layer 12 is formed over substrate 10. Insulator layer 12 acts as a tunnel oxide layer for gate structures 30 that may eventually be formed (FIG. 8). Insulator layer 12 may comprise silicon dioxide, formed, for example, in a thermal furnace with an oxygen-containing ambient. It is noted that insulator layer 12 may comprise other materials suitable for insulating semiconductor elements. In one example, with no intent to limit the invention thereby, the thickness of insulator layer 12 may be on the order of about 90 Å.

A stack layer 14 comprising silicon nitride and polysilicon together, in one example, or silicon nitride alone, in another example, is used to eventually form gates of flash memory transistors and/or to stop a later planarization step. Stack layer 14 is formed over insulator layer 12, as illustrated in FIG. 2.

Figure 7:
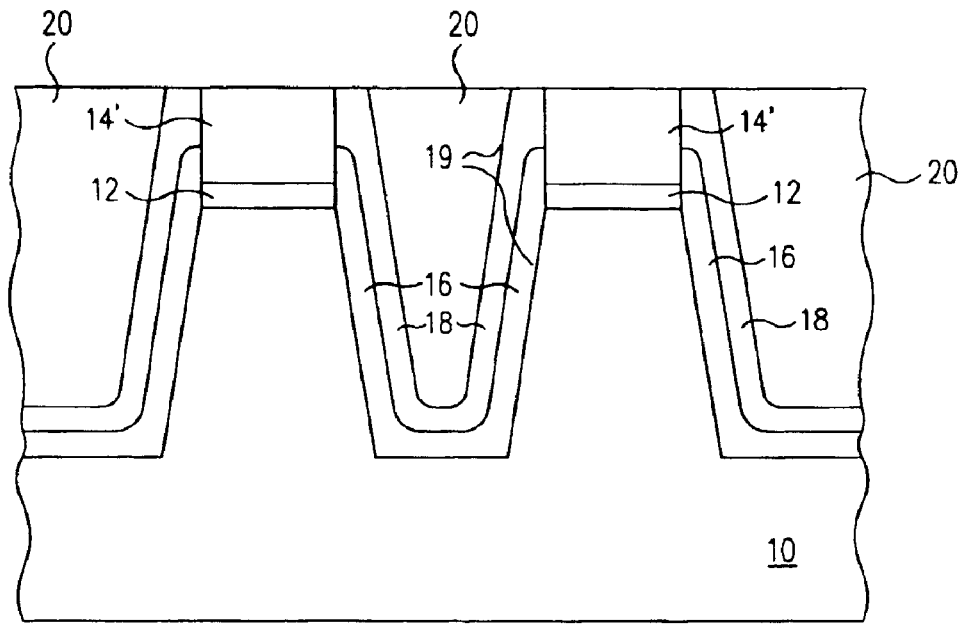
FIG. 7 shows a cross-section view of the structure illustrated in FIG. 6 after a planarization step, in accordance with an embodiment of the present invention.

In one embodiment, stack layer 14 comprises amorphous silicon and may be doped as the layer is deposited. In one example, dopants may comprise phosphorous and/or nitrogen. For example, to create n-type polysilicon material, phosphorous doping agents may be introduced at different dosage and energy levels. Stack layer 14 further comprises a nitride layer formed on top of the polysilicon layer. The nitride layer acts as a stop layer for a later planarization step (FIG. 7). In another embodiment, stack layer 14 comprises a nitride layer without a polysilicon layer and simply functions as a stop layer for a subsequent planarization step (FIG. 7).

In one example, with no intent to limit the invention thereby, stack layer 14 comprising silicon nitride and polysilicon may be formed to a thickness of about 2,700 Å by suitable deposition processes, such as a low pressure chemical vapor deposition (LPCVD) process. In this example, the silicon nitride layer is about 900 Å and the polysilicon layer is about 1,800 Å. In another example, stack layer 14, comprising silicon nitride without the polysilicon layer, may be formed to a thickness of about 900 Å. It is noted that the invention is not limited to the aforementioned examples but will involve various stack layer thicknesses depending upon the performance of subsequent planarization steps and/or desired gate fabrication.

Thereafter, a photoresist layer 15 is formed over stack layer 14 to be used for later patterning of underlying layers to form active regions and trenches. Photoresist layer 15 may be defined using standard photoresist coating, exposure, and development processes known in the conventional lithography technology.

Referring now to FIG. 3, the stack layer, insulator layer, and substrate are anisotropically etched using photoresist layer is as a mask to form trench 11 and stack structures 14'. Trench 11 is formed to desired heights H and widths W. In one example, trench height H may be about 0.3 μm and trench width W may be about 0.2 μm measured at the top of substrate 10. However, it should be understood that the present invention may be used with various trench heights and widths and various geometries ranging beyond the aforementioned examples. The patterning step can be performed by conventional anisotropic etch processes, such as reactive ion etch (RIE) processes.

The structure illustrated in FIG. 3 is the result after the aforementioned process steps have been performed. Photoresist layer 15 is eventually stripped from the top of stack structures 14' by a conventional process, such as a resist ash, in one example, resulting in the structure illustrated in FIG. 4.

Figure 4:
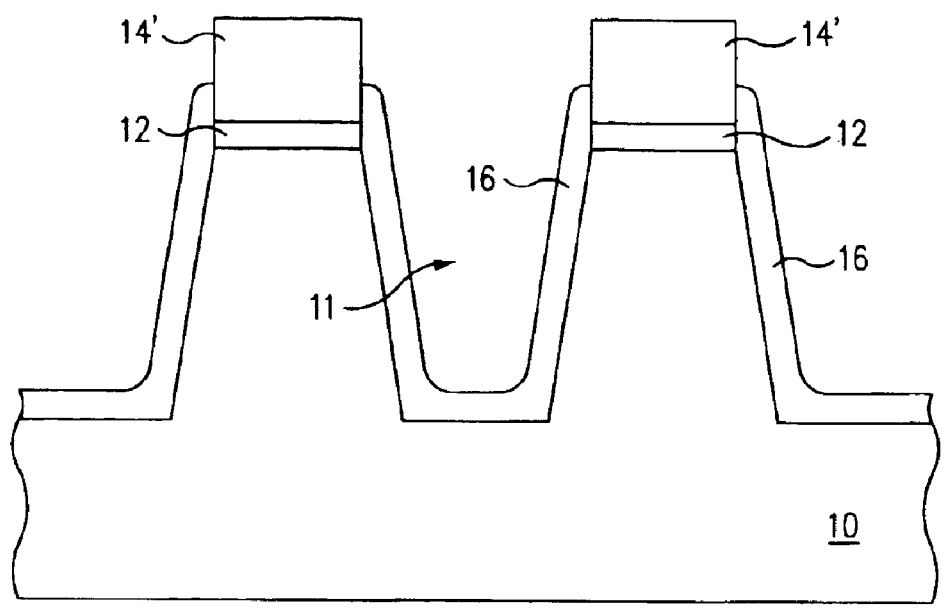
FIG. 4 shows a cross-section view of the structure illustrated in FIG. 3 after a thermal oxide layer is formed over the trenches, in accordance with an embodiment of the present invention.
Figure 5:
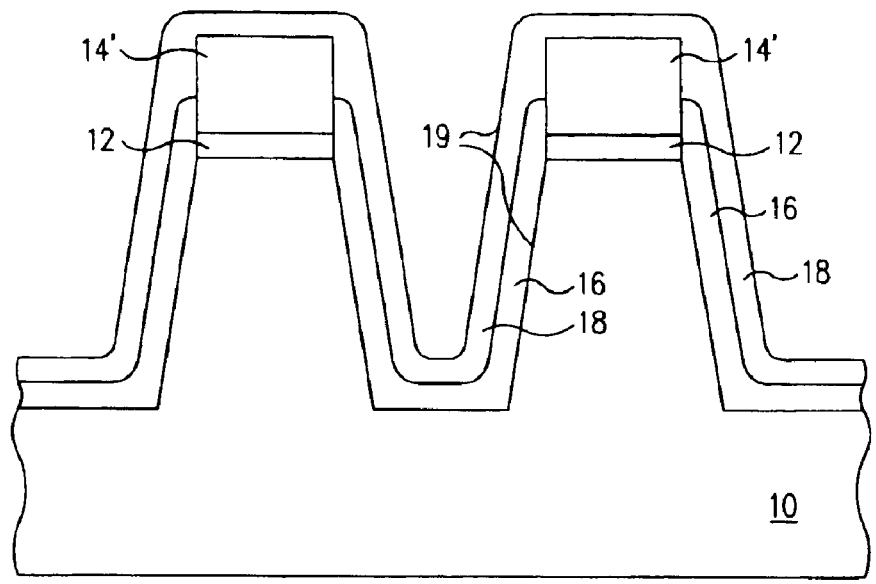
FIG. 5 shows a cross-section view of the structure illustrated in FIG. 4 after an in-situ oxide layer is formed over the topography of the structure, in accordance with an embodiment of the present invention.

FIGS. 4 and 5 illustrate the formation of one embodiment of an oxide liner that is formed over trench 11 and stack structures 14'. As shown in FIG. 4, a thermal oxide layer 16 may be grown over the bottom and side surfaces of trench 11. In one example, with no intent to limit the invention thereby, thermal oxide layer 16 has a thickness of about 35 Å and is conformally formed on a portion of stack structures 14', insulator layer 12, and substrate 10, to cover the inner surfaces of trench 11. It is noted that thermal oxide layer 16 is grown on the exposed surfaces of polysilicon included in stack structures 14' to protect the polysilicon material. If stack structures 14' did not include polysilicon but only nitride, thermal oxide layer 16 could be grown to cover only the exposed surfaces of insulator layer 12 and the inner surfaces of trench 11 and not the exposed nitride.

Thermal oxide layer 16 may be grown by performing thermal oxidation in any applicable apparatus, such as a furnace. The thermal oxidation may be performed at a temperature between about 900° C. and about 1,000° C., in one example.

Referring now to FIG. 5, an in-situ oxide layer 18 is deposited by an HDP-CVD process, preferably conformally, over thermal oxide layer 16 and stack structures 14'. In one example, in-situ oxide layer 18 is deposited using a source radio frequency (RF) for generating radicals in the HDP-CVD process but no bias power or low bias power is applied to the substrate. Low or no bias power prevents damage to thermal oxide layer 16 and/or the underlying device including the polysilicon of stack structures 14', insulator layer 12, and substrate 10, potentially caused by etching/sputtering. In one example, in-situ oxide layer 18 is formed with a thickness between about 100 Å to about 300 Å in a trench having a width of about 0.2 μm. It should be understood that in-situ oxide layer 18 is not limited to having a uniform thickness but may instead have a non-uniform thickness, for example, having a larger thickness over stack structure 14 than along the trench sidewalls. In a further example, bias power may be between about 0 watts and about 500 watts but will vary depending on factors such as thermal oxide layer thickness. In one example, in-situ oxide layer 18 may comprise silicon dioxide, formed from reaction gases such as silane ($SiH_4$), oxygen ($O_2$), and helium (He).

Figure 6:
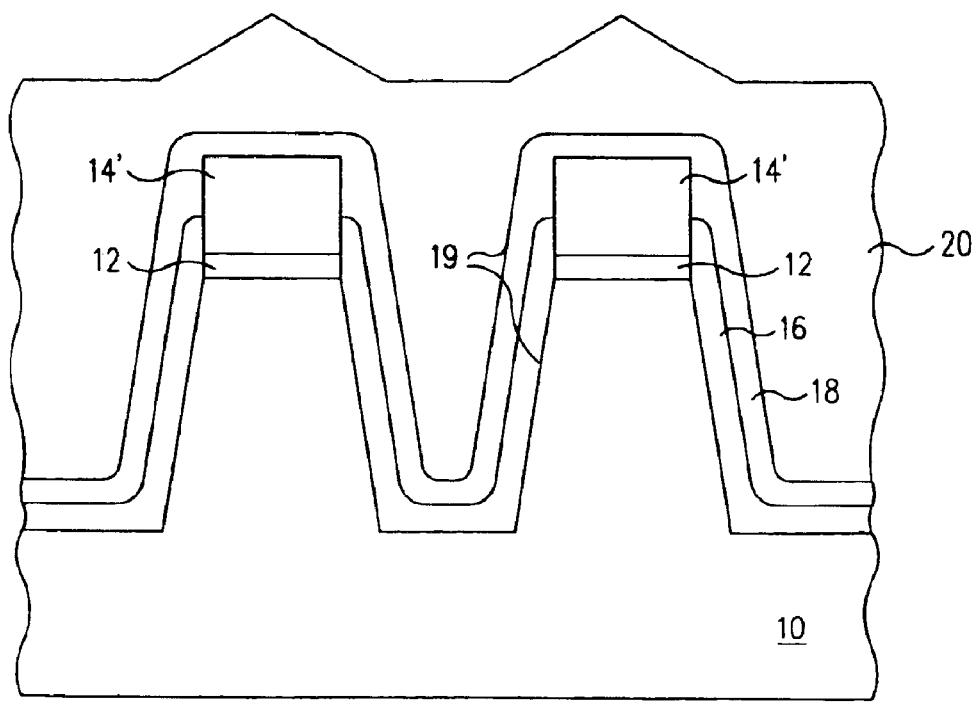
FIG. 6 shows a cross-section view of the structure illustrated in FIG. 5 after a bulk oxide layer is formed over the in-situ oxide layer to fill the trenches, in accordance with an embodiment of the present invention.

Accordingly, in this embodiment, thermal oxide layer 16 and in-situ oxide layer 18 constitute an oxide liner 19. However, it should be understood that oxide liner 19 may comprise other applicable oxide layers, alone or in combination, at various thicknesses to prevent damage to the substrate (and/or underlying layers) during a subsequent bulk oxide deposition step (FIG. 6). In another embodiment, oxide liner 19 may comprise a rapid thermal oxide (RTO) layer formed by a rapid thermal process. This technique advantageously reduces oxygen diffusion, thereby reducing oxidation in the corners of the active area and the tunnel oxide.

FIG. 6 illustrates the formation of a bulk oxide layer 20 to fill the trench and cover the gate structures and/or nitride stop layer. In one embodiment, bulk oxide layer 20 is formed by HDP-CVD but may be formed by any applicable deposition process. Advantageously, when both in-situ oxide layer 18 and bulk oxide layer 20 are formed by HDP-CVD, the process steps for forming the trench isolation structure is decreased, reducing the process thermal budget and cycle time. Bulk oxide layer 20 is required to fill the trench, and accordingly, will have different thicknesses based upon trench height. In one example, bulk oxide layer 20 may comprise silicon dioxide, formed from reaction gases such as silane ($SiH_4$), oxygen (O2), and helium (He). In one embodiment, the HDP-CVD process is performed with a substrate bias power between about 1,000 watts and about 3,000 watts to form a bulk oxide layer 20 having a thickness of about 6,000 Å for a trench width of about 0.2 μm. Advantageously, oxide liner 19 (e.g., thermal oxide layer 16 and in-situ oxide layer 18) protects the polysilicon of stack structures 14', insulator layer 12, and substrate 10 from potential plasma damage during this main deposition step.

In accordance with the present invention, oxide liner 19 is formed to have a similar refractive index as the refractive index of bulk oxide layer 20. In one example, with no intent to limit the invention thereby, the refractive index of bulk oxide layer 20 is about 1.46 and accordingly, oxide liner 19 is formed to have a similar refractive index of about 1.46.

For the same dielectric materials and same deposition process, having similar refractive indices correlate to the materials having similar etch rates. Thus, by maintaining similar refractive indices, the aforementioned dielectric oxide layers filling trench 11 may be etched to form a common dielectric top surface 22 (FIG. 8) that is substantially planar and without grooves. In one example, similar etch rates correspond to the etch rates of bulk oxide layer 20 and oxide liner 19 being within about 10% of one another. In a further example, similar refractive indices correspond to the refractive indices of bulk oxide layer 20 and oxide liner 19 being within about 5% of one another.

After bulk oxide layer 20 is deposited, a thermal anneal process is performed to densify the deposited dielectric and to improve the characteristics of the dielectric as an insulation material.

As shown in FIG. 7, bulk oxide layer 20 and in-situ oxide layer 18 are then planarized downward until a portion of stack structures 14', in particular the nitride layer, is contacted or removed. In one example, chemical mechanical planarization (CMP) is performed to remove top portions of bulk oxide layer 20 and in-situ oxide layer 18.

Figure 1:
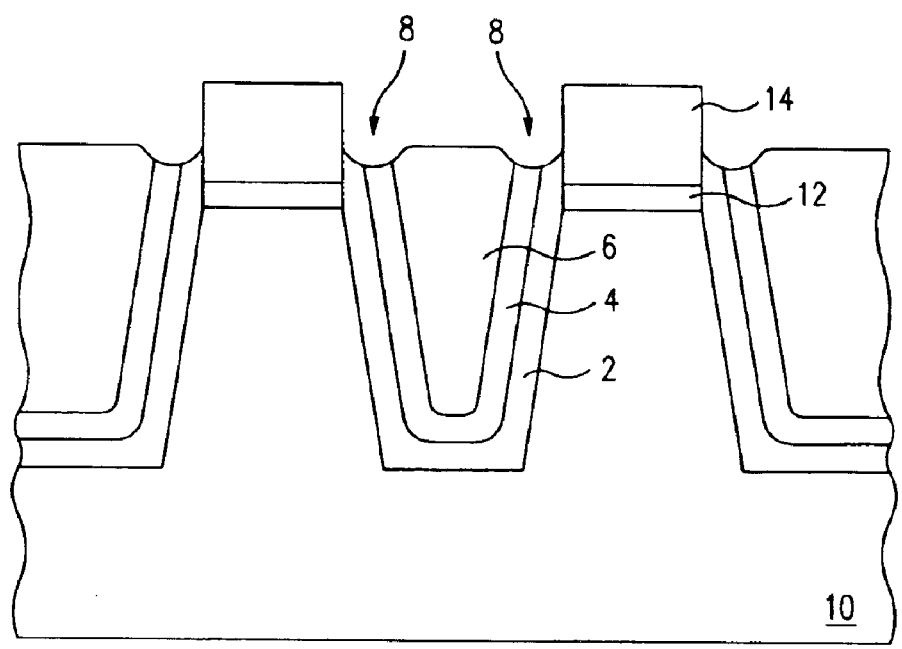
FIG. 1 shows a cross-section view of a semiconductor substrate with trenches filled with oxide layers that have grooves after an etch step.

An etch step follows the planarization step to etch bulk oxide layer 20 and oxide liner 19 to form a level dielectric top surface 22 between stack structures 14, as shown in FIG. 8. This etch step may be performed by conventional wet etch or dry etch methods, such as by using a conventional diluted HF solution or BOE solution, in one example. Advantageously, when an etch is performed in accordance with the present invention, bulk oxide layer 20 and oxide liner 19 (e.g., in-situ oxide layer 18 and thermal oxide layer 16) are etched downward below a top surface 32 of stack structures 14' to expose sidewall portions of stack structures 14' without grooving at the edges of the trench. In comparison, FIG. 1 illustrates the disadvantageous grooving that typically occurred in the art. In accordance with the present invention, no grooves are formed because oxide liner 19 (e.g., thermal oxide layer 16 and in-situ oxide layer 18) has a similar etch rate as bulk oxide layer 20. Different levels of stack structures 14' will be exposed based upon process and application requirements.

The present invention also allows for a relatively improved thermal budget and process cycle time because in one embodiment, the present invention includes only two dielectric deposition steps (thermal dielectric step and HDP-CVD step) as opposed to the three oxide deposition steps (thermal oxide step and HTO step and gapfill oxide step) conventionally used. In one example, with no intent to limit the invention thereby, a wet etch may be performed in a conventional wet etch tank, such as a recirculating, filtered tank, model US-600, available from Universal Systems located in San Jose, Calif.

The above-described embodiments of the present invention are merely meant to be illustrative and not limiting. Various changes and modifications may be made within the scope of this invention. Therefore, the appended claims encompass all such changes and modifications.

What is claimed is:

1. A trench isolation structure, comprising:
   two stack structures over a substrate;
   a trench in the substrate between the two stack structures;
   an oxide liner over the trench, wherein the oxide liner includes a thermal oxide layer and an in-situ oxide layer; and
   a bulk oxide layer over the oxide liner, wherein the etch rate of the oxide liner is within about 10% of the etch rate of the bulk oxide layer.

2. The structure of claim 1, wherein the oxide liner is formed to have a refractive index within about 5% of the refractive index of the bulk oxide layer.

3. The structure of claim 2, wherein the refractive index of the oxide liner is about 1.46.

4. The structure of claim 1, wherein the oxide liner comprises a rapid thermal oxide layer.

5. The structure of claim 1, wherein a top surface of the bulk oxide layer and the oxide liner is below a top surface of the two stack structures.

6. The structure of claim 1, wherein the stack structures are comprised of silicon nitride and polysilicon.

7. The structure of claim 1, wherein the thermal oxide layer has a thickness of about 35 Å.

8. The structure of claim 1, wherein the in-situ oxide layer has a thickness between about 100 Å and about 300 Å.

9. The structure of claim 1, further comprising a tunnel oxide layer over the substrate and under the two stack structures.

10. The structure of claim 9, wherein the tunnel oxide layer has a thickness of about 90 Å.

11. A trench isolation structure, comprising:

two stack structures over a substrate;

a trench in the substrate between the two stack structures;

a thermal oxide layer over the trench;

an in-situ oxide layer over the thermal oxide layer and over the two stack structures; and a bulk oxide layer over the in-situ oxide layer, wherein the etch rate of the thermal oxide layer and the in-situ oxide layer is substantially similar to the etch rate of the bulk oxide layer.

12. The structure of claim 11, wherein the thermal oxide layer and the in-situ oxide layer have a refractive index within about 5% of the refractive index of the bulk oxide layer.

13. The structure of claim 12, wherein the refractive index of the thermal oxide layer and the in-situ oxide layer is about 1.46.

14. The structure of claim 11, wherein a top surface of the bulk oxide layer, the thermal oxide layer, and the in-situ oxide layer is below a top surface of the two stack structures.

15. The structure of claim 11, wherein the stack structures are comprised of silicon nitride and polysilicon.

16. The structure of claim 11, wherein the thermal oxide layer has a thickness of about 35 Å.

17. The structure of claim 11, wherein the in-situ oxide layer has a thickness between about 100 Å and about 300 Å.

18. The structure of claim 11, further comprising a tunnel oxide layer over the substrate and under the two stack structures.

19. The structure of claim 18, wherein the tunnel oxide layer has a thickness of about 90 Å.

* * * * *